United States Patent
Lu et al.

(10) Patent No.: US 7,126,818 B2
(45) Date of Patent: Oct. 24, 2006

(54) HEAT DISSIPATION MODULE WITH TWIN CENTRIFUGAL FANS

(75) Inventors: Cheng-Yi Lu, Chung Li (TW); Te-Tsai Chuang, Taoyuan (TW); Kuo-Cheng Lin, Taoyuan (TW); Wen-Shi Huang, Chung Li (TW)

(73) Assignee: Delta Electronics, Inc. (TW)

( * ) Notice: Subject to any disclaimer, the term of this patent is extended or adjusted under 35 U.S.C. 154(b) by 208 days.

(21) Appl. No.: 10/743,721

(22) Filed: Dec. 24, 2003

(65) Prior Publication Data

US 2004/0207983 A1    Oct. 21, 2004

(30) Foreign Application Priority Data

Apr. 18, 2003  (TW) .............................. 92206190 U

(51) Int. Cl.
*H05K 7/20* (2006.01)
*F24F 7/007* (2006.01)

(52) U.S. Cl. ...................... 361/695; 361/694; 454/186
(58) Field of Classification Search ................ 361/695, 361/694; 454/184–186
See application file for complete search history.

(56) References Cited

U.S. PATENT DOCUMENTS

| | | | | |
|---|---|---|---|---|
| 5,460,441 A | * | 10/1995 | Hastings et al. | ............ 312/298 |
| 5,772,500 A | * | 6/1998 | Harvey et al. | ............... 454/184 |
| 5,871,396 A | * | 2/1999 | Shen | ........................... 454/184 |
| 6,042,474 A | * | 3/2000 | Harvey et al. | ............... 454/184 |
| 6,384,733 B1 | * | 5/2002 | Seesemann | ................... 340/648 |
| 6,414,845 B1 | * | 7/2002 | Bonet | .......................... 361/695 |
| 6,592,327 B1 | * | 7/2003 | Chen et al. | ............... 415/213.1 |
| 6,801,428 B1 | * | 10/2004 | Smith et al. | ................. 361/687 |
| 6,813,152 B1 | * | 11/2004 | Perazzo | ...................... 361/695 |
| 2001/0037985 A1 | * | 11/2001 | Varghese et al. | ............... 211/26 |
| 2002/0063476 A1 | * | 5/2002 | Rolls et al. | .................. 307/117 |
| 2002/0094283 A1 | * | 7/2002 | Salmen et al. | ............... 417/360 |
| 2002/0199048 A1 | * | 12/2002 | Rabinovitz | ................... 710/100 |

* cited by examiner

*Primary Examiner*—Anatoly Vortman

(57) ABSTRACT

A heat dissipation module with twin centrifugal fans is described. The heat dissipation module is utilized in an electrical equipment and especially for a computer server system. The heat dissipation module has a honeycomb panel, a first fan, an air duct, a second fan and a plurality of sliding rails. The honeycomb panel connects with an outlet of the first fan and an out of the air duct in the rear side thereof. The first fan sucks hot air from the underside thereof and exhausts the hot air to the outside through the honeycomb panel. The second fan sucks hot air from the underside thereof and exhausts the hot air to the outside through the honeycomb by way of the air duct. The sliding rails configure along the two sides of the first fan and the second fan.

15 Claims, 2 Drawing Sheets

HEAT DISSIPATION MODULE WITH TWIN CENTRIFUGAL FANS

FIELD OF THE INVENTION

The present invention relates to a heat dissipation module, and especially, to a heat dissipation module with centrifugal fans.

BACKGROUND OF THE INVENTION

Due to the rapid progress of the computer industry, information technology is highly developed now. Additionally, network applications are full of vitality so that a great quantity of data transmission and calculation are transmitted by networks. Therefore, more computer equipment is provided for data calculation and process by way of network connections.

Because the functional requirements of the semiconductor are highly intense, the electric circuit layout of the semiconductor is more complicated and more sophisticated. The computer equipment is increasingly powerful. Powerful computer equipment with complicated and sophisticated semiconductors induces a serious problem. That is, a complicated and sophisticated semiconductor has a higher power consumption and thus severely elevates the working temperature of the computer equipment.

Normally, a higher working temperature can cause instability in a working system, and especially in computer equipment. A lower working temperature makes a computer equipment more stable. That is to say, if the working temperature of the computer equipment can be kept lower, the performance thereof is higher. Nevertheless, if the working temperature is too high, the performance and stability will decrease and the operation system may even crash, in some extreme situations.

Therefore, a heat dissipation device is very important for the computer equipment and especially to a computer server system. Because a computer server system works continuously, the heat accumulation is more severe than in normal computer equipment, e.g. a personal computer. Additionally, a computer server system normally possesses more than one computer server installed in a rack. Accordingly, the heat dissipation device of the computer server system is more serious and important.

SUMMARY OF THE INVENTION

One object of the present invention is to provide a heat dissipation module with twin centrifugal fans for improving the heat dissipation efficiency thereof.

Another object of the present invention is to provide a sliding rail with simple assembling and positioning procedures for convenient and efficient installation of a heat dissipation module in a server computer system.

Yet another object of the present invention is to provide a heat dissipation module with twin centrifugal fans, which module is capable of rotational speed control, temperature detection, status display, and vibration absorption.

To achieve these and other advantages and in accordance with the object of the invention, the present invention provides a heat dissipation module with twin centrifugal fans utilized in an electrical equipment and especially for a computer server system. The heat dissipation module includes a honeycomb panel, a first fan, an air duct, a second fan, and a plurality of sliding rails. The honeycomb panel is disposed on a front surface of the heat dissipation module and the inner side thereof couples to an outlet of the first fan and the air duct. The first fan sucks part of the hot air generated by the electrical equipment and exhausts that part of the hot air outside of the heat dissipation module by way of the first outlet and the honeycomb panel.

The second fan sucks another part of the hot air generated by the electrical equipment and exhausts the another part of the hot air outside the heat dissipation module by way of the outlet of the second fan, the air duct and the honeycomb panel.

The sliding rails are formed by edges of an upper cover and a bottom cover and are fixed on both sides of the first fan and the second fan. The sliding rails provide the heat dissipation module with the ability to slide and couple to the electrical equipment while the heat dissipation module is being inserted into the electrical equipment.

The electrical equipment further comprises a plurality of corresponding rails for coupling with the sliding rails of the heat dissipation module. The heat dissipation module further comprises a locking device, e.g. a locking screw, to efficiently fix with the electrical equipment after the heat dissipation module is installed in the electrical equipment.

The heat dissipation module according to the present invention further includes a temperature-detecting device for controlling rotational speeds of the first fan and the second fan. Further, the heat dissipation module includes a spring device for absorbing vibrations caused by the first fan and the second fan and removing an electromagnetic wave to a ground circuit. The sliding rails of the heat dissipation module are directly formed on the upper cover and the bottom cover; therefore the rails are fixed with the first fan and the second fan while the upper cover and the bottom cover are fixed with the first fan and the second fan without any additional time for installing the rails.

The heat dissipation module according to the present invention is utilized in a computer server system. Multiple heat dissipation modules are installed at the top level of the computer sever system to exhaust the heat generated by the computer system.

The heat dissipation module according to the present invention is convenient to install in a computer server system to enhance the heat dissipation efficiency, reduce the manufacture cost thereof, and reduce the power consumption thereof by controlling the rotational speed of the fans by way of temperature detection.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is the best presently contemplated mode of carrying out the present invention. This description is not to be taken in a limiting sense but is made merely for the purpose of describing the general principles of the invention. The scope of the invention should be determined by referencing the appended claims.

Figure 1A:
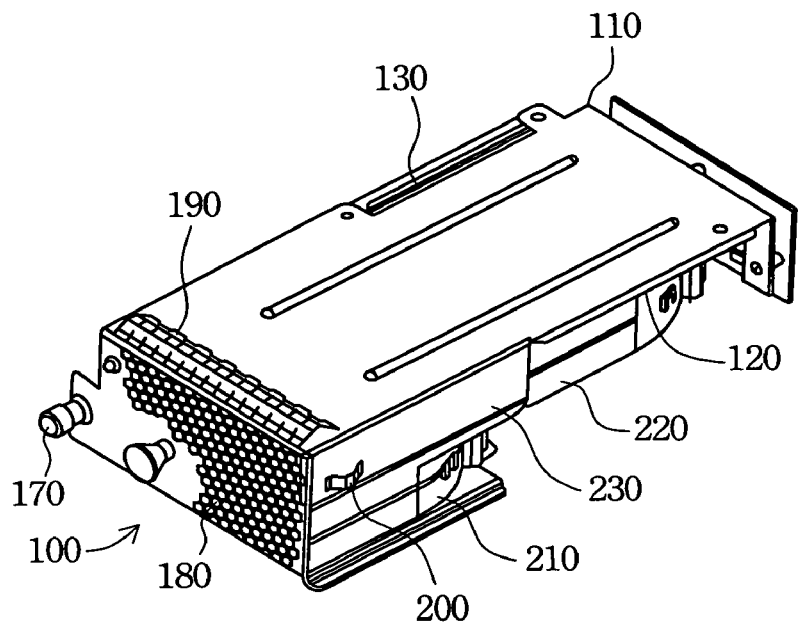
FIG. 1A is a schematic view of a heat dissipation module with twin centrifugal fans according to the present invention.
Figure 1B:
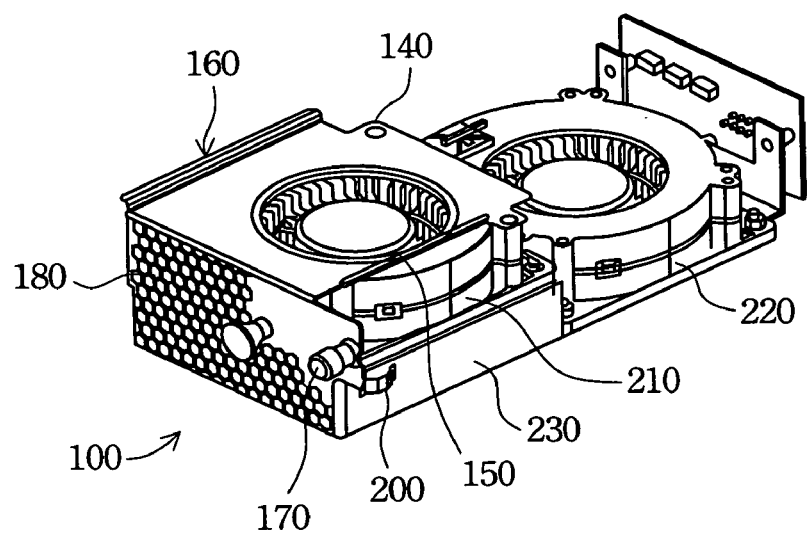
FIG. 1B is a schematic rear view of a heat dissipation module with twin centrifugal fans of FIG. 1A.

FIG. 1A is a schematic view of a heat dissipation module with twin centrifugal fans according to the present invention and FIG. 1B is a schematic rear view thereof. The heat dissipation module 100 with twin centrifugal fans according to the present invention includes a first fan 210, a second fan 220, and an air duct 230. The heat dissipation module 100 utilizes two centrifugal fans, the first fan 210 and the second fan 220 to increase the exhausting air volume and the cooling efficiency of the heat dissipation module 100. Additionally, the total cost of the heat dissipation module 100 can be reduced because the first fan 210 and the second fan 220 are both the same type of centrifugal fan.

The heat dissipation module 100 utilizes the air duct 230 to guide the air exhausted by an outlet of the second fan 220 directly out of the heat dissipation module 100 so that the hot air generated by electrical equipment, such as a computer server system, can instantly exhaust from the inside of the electrical equipment. The air duct 230 further constructs a support structure on which the first fan 210 is secured. The first fan 210 is disposed in the front portion of the heat dissipation module 100 and the first fan 210 sucks the hot air from the bottom side thereof and directly exhausts out of the heat dissipation module 100 by an outlet thereof.

The air-extracting area and the cooling efficiency of the heat dissipation module 100 are increased because the first fan 210 is disposed in the front portion of the heat dissipation module 100 and the second fan 220 is disposed in the rear portion of the heat dissipation module 100. Therefore, the hot air generated by a heat source, such as a computer motherboard or any heat-generating device, under the heat dissipation module 100, whether in the front portion or the rear portion, can be instantly efficiently exhausted out of the heat dissipation module 100, that is, out of the electrical equipment. Accordingly, the inside of the electrical equipment can be maintained at a suitable working temperature.

The heat dissipation module 100 further utilizes sliding rails 120, 130, 150 and 160 to achieve a fast installation in the heat dissipation 100. The sliding rails 120, 130, 150 and 160 are disposed in the periphery of the heat dissipation module 100 so that the heat dissipation module 100 can be very easily installed in the electrical equipment to enhance the installation and removal speed of the heat dissipation module 100, and can further increase the stability of the heat dissipation module 100 in the electrical equipment.

The heat dissipation module 100 further utilizes a locking device 170, such as a locking screw, to further increase the stability of the heat dissipation module 100 in the electrical equipment. A honeycomb panel 180 efficiently reduces the drag coefficient to enhance the volume of air exhausted and the cooling efficiency. The honeycomb panel 180 is fixed on the front surface of the heat dissipation module 100 and the inner surface of the honeycomb panel 180 connects to the outlet of the first fan 210 and the air duct 230. Another side of the air duct 230 further connects to the outlet of the second fan 220. A spring device 190 and a spring device 200 absorb the vibration induced by the rotations of the fans 210 and 220, and further guide an electromagnetic wave into the ground circuit.

The sliding rails 120, 130, 150 and 160 are designed on an upper cover 110 and a bottom cover 140 respectively. When the upper cover 110, the bottom cover 140, the first fan 210 and the second fan 220 are assembled together, the sliding rails 120, 130, 150 and 160 are simultaneously disposed on the two sides of the first fan 210 and the second fan 220. Because the sliding rails 120, 130, 150 and 160 are directly formed by edges of the upper cover 110 and the bottom cover 140, the sliding rails 120, 130, 150 and 160 can guide the heat dissipation module 100 to install in the electrical equipment and spend no additional time for assembling the rails 120, 130, 150 and 160 in the heat dissipation module 100.

Figure 2:
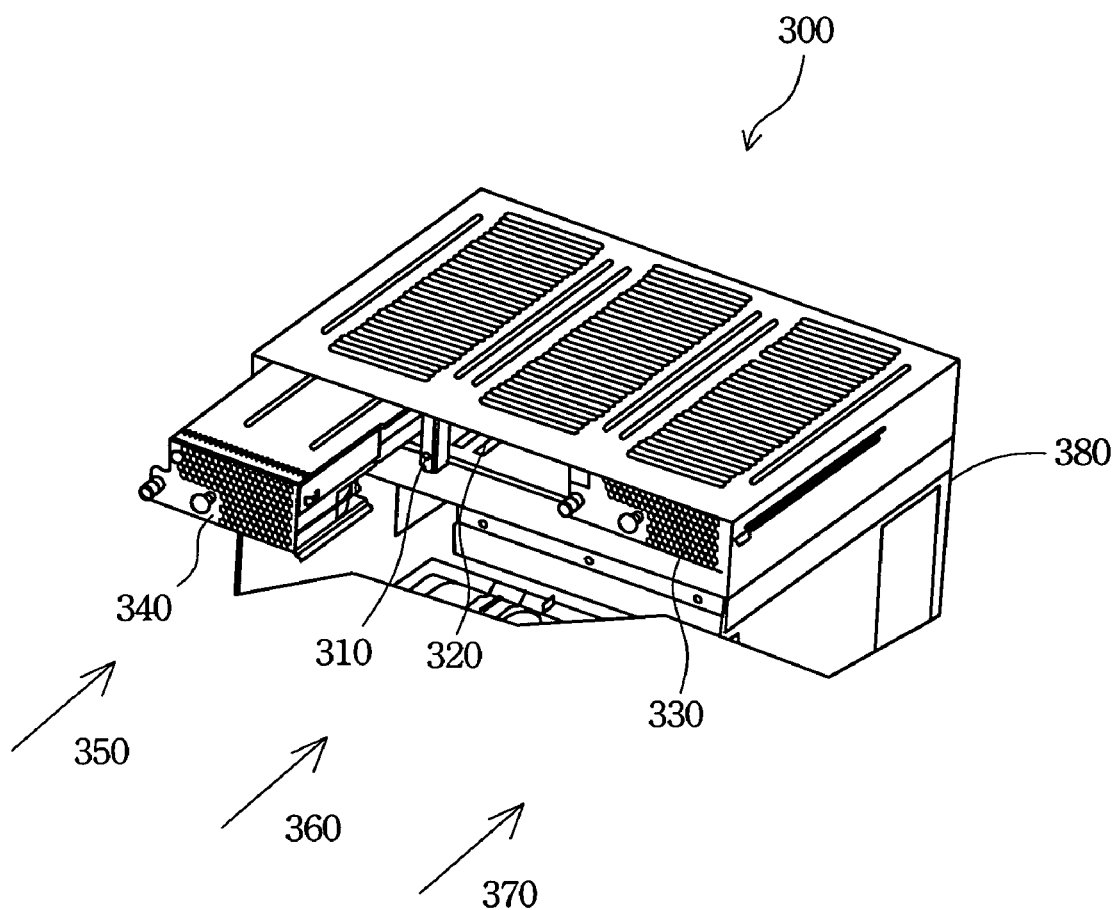
FIG. 2 is a schematic view of a heat dissipation module with twin centrifugal fans according to the present invention installing on a computer server system.

FIG. 2 is a schematic view of a heat dissipation module with twin centrifugal fans according to the present invention, installed in a computer server system. The computer server system 300 has a plurality of fixing slots 350 for fixing the heat dissipation modules on a rack 380 to enhance the cooling efficiency of the whole computer server system 300. For ease in illustrating the rail 320 in the fixing slot 360, the fixing slot 360 is shown empty. The heat dissipation module 330 is fixed in the fixing slot 370 and the heat dissipation module 340 is installed in the fixing slot 350. Each of the fixing slots 350, 360 and 370 includes sliding rails corresponding to the sliding rails 120, 130, 150 and 160 (see FIGS. 1A and 1B). The corresponding rails are installed in the fixing slots 350, 360 and 370 to couple with the sliding rails 120, 130, 150 and 160 while the heat dissipation modules 330 and 340 are being inserting into the fixing slots 370 and 350, respectively, so as to easily install the heat dissipation module 330 and 340 on the rack 380, efficiently guide connectors of the heat dissipation module 330 and 340 coupling to system connectors, and accurately align the heat dissipation modules 330 and 340 in the fixing slots 370 and 350.

Each of the fixing slots 350, 360 and 370 further includes a locking hole 310. After the heat dissipation module is installed in the fixing slot by way of coupling to the sliding rails thereof, the heat dissipation module is further fixed by the locking device 170 (see FIGS. 1A and 1B) and the locking hole 310 to firmly fix the heat dissipation module on the rack 380 of the computer server system 300. Therefore, the heat dissipation module of the present invention not only possesses a higher heat dissipation efficiency but also can be quickly installed in the rack of the computer server system, and further utilizes the honeycomb panel to increase exhausting air volume with a lower noise. The heat dissipation module further includes a temperature-detecting device to control the rotational speed of the fans for reducing the power consumption. The heat dissipation module sucks the hot air generated by the computer server system from the bottom side thereof and exhausts the hot air in the front side thereof according to the theory of thermal air convection, therefore further increasing the heat dissipation efficiency. Furthermore, the heat dissipation module has a control device to connect with the server computer system for exchanging signals and controlling the heat dissipation module. Therefore, the heat dissipation module provides a function of hot swap, a handle, and an indicator, which are convenient to a user operating and controlling the heat dissipation module.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation module with twin centrifugal fans, comprising:

a honeycomb panel disposed on a front surface of the heat dissipation module;
a first fan having an first outlet coupling to an inner surface of the honeycomb panel, and the first fan sucking a part of hot air generated by an electrical equipment and exhausting the part of the hot air out of the heat dissipation module by way of the first outlet and the honeycomb panel;
an air duct coupling to the inner side of the honeycomb panel and on a top of the first fan;
a second fan having a second outlet coupling to a rear side of the air duct, and the second fan sucking another part of the hot air generated by the electrical equipment and exhausting part of the hot air out of the heat dissipation module by way of the second outlet, the air duct and the honeycomb panel; and
an upper cover and a bottom cover, wherein edges of the upper cover and the bottom cover are provided with sliding rails on both sides of the first fan and the second fan of the heat dissipation module, the upper cover and the bottom cover are utilized to couple with the first fan and the second fan, and the sliding rails provides the heat dissipation module with an ability to slide and couple to the electrical equipment while the heat dissipation module is being inserted into the electrical equipment.

2. The heat dissipation module with twin centrifugal fans as described in claim 1, wherein the electrical equipment further comprises a plurality of corresponding rails for coupling with the sliding rails of the heat dissipation module.

3. The heat dissipation module with twin centrifugal fans as described in claim 2, wherein the electrical equipment is a computer server system.

4. The heat dissipation module with twin centrifugal fans as described in claim 1, wherein the heat dissipation module further comprises a locking device to fix to the electrical equipment after the heat dissipation module is installed in the electrical equipment.

5. The heat dissipation module with twin centrifugal fans as described in claim 4, wherein the locking device is a locking screw.

6. The heat dissipation module with twin centrifugal fans as described in claim 1, wherein the heat dissipation module further comprises a temperature-detecting device for controlling rotational speeds of the first fan and the second fan.

7. The heat dissipation module with twin centrifugal fans as described in claim 1, wherein the heat dissipation module further comprises a spring device for absorbing vibrations caused by the first fan and the second fan and removing an electromagnetic wave.

8. A heat dissipation module with twin centrifugal fans utilized in a computer server system, the heat dissipation module comprising:
a honeycomb panel disposed on a front surface of the heat dissipation module;
a first fan having a first outlet coupling to an inner surface of the honeycomb panel, and the first fan sucking a part of hot air generated by an electrical equipment and exhausting the part of the hot air out of the heat dissipation module by way of the first outlet and the honeycomb panel;
an air duct coupling to the inner side of the honeycomb panel and on a top of the first fan;
a second fan having a second outlet coupling to a rear side of the air duct, and the second fan sucking another part of the hot air generated by the electrical equipment and exhausting part of the hot air out of the heat dissipation module by way of the second outlet, the air duct and the honeycomb panel;
an upper cover and a bottom cover, wherein edges of the upper cover and the bottom cover are provided with sliding rails on both sides of the first fan and the second fan of the heat dissipation module, the upper cover and the bottom cover are utilized to couple with the first fan and the second fan, and the sliding rails provides the heat dissipation module sliding and coupling to the electrical equipment while the heat dissipation module is being inserted into the electrical equipment;
a plurality of spring devices for absorbing vibrations caused by the first fan and the second fan and removing an electromagnetic wave; and
a temperature-detecting device for controlling rotational speeds of the first fan and the second fan.

9. The heat dissipation module with twin centrifugal fans as described in claim 8, wherein the computer server system further comprises a plurality of corresponding rails for coupling with the sliding rails of the heat dissipation module.

10. The heat dissipation module with twin centrifugal fans as described in claim 8, wherein the heat dissipation module further comprises a locking device to fix to the computer server system after the heat dissipation module is installed in the computer server system.

11. The heat dissipation module with twin centrifugal fans as described in claim 10, wherein the locking device is a locking screw.

12. A computer server system, comprising:
a server rack installing a plurality servers thereon;
a plurality fixing slots disposed in a top portion of the server rack; and
a plurality of heat dissipation modules with twin centrifugal fans disposed in the fixing slots, wherein each of the heat dissipation modules further comprises:
a honeycomb panel disposed on a front surface of the heat dissipation module;
a first fan having a first outlet coupling to an inner surface of the honeycomb panel, and the first fan sucking a part of hot air generated by an electrical equipment and exhausting the part of the hot air out of the heat dissipation module by way of the first outlet and the honeycomb panel;
an air duct coupling to the inner side of the honeycomb panel and on a top of the first fan;
a second fan having a second outlet coupling to a rear side of the air duct, and the second fan sucking another part of the hot air generated by the electrical equipment and exhausting part of the hot air out of the heat dissipation module by way of the second outlet, the air duct and the honeycomb panel;
an upper cover and a bottom cover, wherein edges of the upper cover and the bottom cover are provided with sliding rails on both sides of the first fan and the second fan of the heat dissipation module, the upper cover and the bottom cover are utilized to couple with the first fan and the second fan, and the sliding rails provides the heat dissipation module with an ability to slide and couple with the electrical equipment while the heat dissipation module is being inserted into the electrical equipment;
a plurality of spring devices for absorbing vibrations caused by the first fan and the second fan and removing an electromagnetic wave; and a temperature-detecting device for controlling rotational speeds of the first fan and the second fan.

13. The computer server system as described in claim 12, wherein each of the fixing slots further comprises a plurality of corresponding rails for coupling with the sliding rails of the heat dissipation module.

14. The computer server system as described in claim 13, wherein the heat dissipation module further comprises a locking device to fix to the computer server system after the heat dissipation module is installed in the computer server system.

15. The computer server system as described in claim 14, wherein the locking device is a locking screw.

* * * * *